United States Patent [19]
Flicstein et al.

[11] Patent Number: 5,221,561
[45] Date of Patent: Jun. 22, 1993

[54] PROCESS FOR THE PHOTOCHEMICAL TREATMENT OF A MATERIAL USING A FLASH TUBE LIGHT SOURCE

[75] Inventors: Jean Flicstein; Yves Nissim; Christian Licoppe, all of Paris; Yves Vitel, Savigny sur Orge, all of France

[73] Assignee: France Telecom, Etablissement autonome de droit public, Paris, France

[21] Appl. No.: 861,286

[22] Filed: Mar. 31, 1992

[30] Foreign Application Priority Data

Apr. 2, 1991 [FR] France .................. 91 03964

[51] Int. Cl.$^5$ ............................ B05D 3/02
[52] U.S. Cl. ........................ 427/534; 427/250;
427/255.2; 427/255.3; 427/444; 427/535;
427/553; 427/557; 427/558; 427/574; 427/579;
427/583; 427/584; 427/585; 427/595
[58] Field of Search .............. 427/534, 250, 255.2,
427/255.3, 444, 535, 553, 557, 558, 574, 579,
583, 584, 585, 595

[56] References Cited

U.S. PATENT DOCUMENTS 4,702,936 10/1987 Maeda et al. .................. 427/54.1

OTHER PUBLICATIONS

Journal of Applied Physics, vol. 64(5) (Fukuki et al.), pp. 2380-2383, May 1988, Deposition of High-quality a-Si:H direct photodecomposition.
Instruments and Experimental Techniques (Yu. G. Basov) pp. 1239-1266, Dec. 1986, Flashlamp Pumping Systems for Dye Lasers.
Instruments and Experimental Techniques (Krymskii et al.), pp. 219-220, Feb. 1975, A Coaxial Lamp for Flash Photolysis.
Journal of Applied Physica, vol. 64(6) (Kawasaki et al.), pp. 3254-3264, Jun. 1988, Study on the Early Stage of Photochemical Vapor Deposition.
Material Science Reports (Hanabusa) pp. 53-59, May 1987, Photoinduced Deposition of Thin Films.
Applied Physics Letter vol. 36(1) (Juh Tseng Lue) pp. 73-76, Oct. 1979 Arc Annealing of $BF^+_2$ Implanted Silicon by a Short Pulse Flash Lamp.

*Primary Examiner*—Bernard Pianalto
*Attorney, Agent, or Firm*—Pearne, Gordon, McCoy & Granger

[57] ABSTRACT

The process for the photochemical treatment of a solid material consists of exposing the latter to light pulses produced by at least one glow discharge elongated tube (4) having a rare gas under low pressure and whereof the gas, the pressure and the characteristics of the discharge are adapted to said material and its precursors, each pulse containing an extensive emission spectrum between 160 and 5000 nm. An electrical circuit with modulatable electrical characteristics (LC) makes it possible to modulate the discharge characteristics of the tube and the storage of the energy necessary for said discharge.

16 Claims, 8 Drawing Sheets

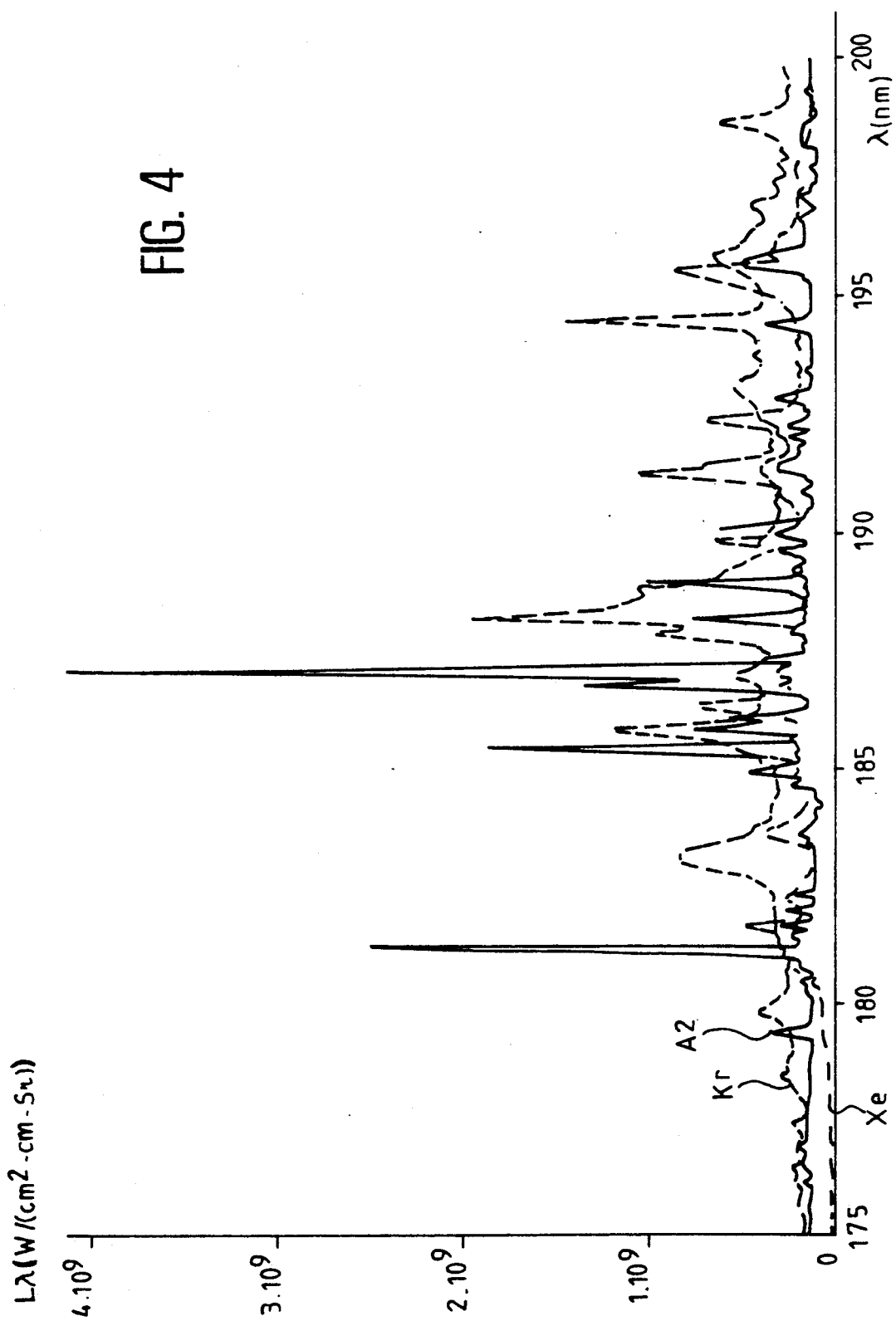

PROCESS FOR THE PHOTOCHEMICAL TREATMENT OF A MATERIAL USING A FLASH TUBE LIGHT SOURCE

The present invention relates to a process for the photochemical treatment of a material and a flash tube or lamp light source for performing this process.

The invention is applicable to any type of dielectric, metallic or semiconductor material used in the field of microelectronics, integrated optics and in any other industrial field requiring the deposition of thick or thin films, the annealing of said film, a chemical surface modification or the cleaning of a substrate.

This treatment process is considered to be "gentle" to the extent that it uses energy levels or temperatures below those causing any deterioration of surfaces. These terms will be defined hereinafter.

More specifically, the invention relates to the deposition of ceramic and dielectric materials. The improvement of the quality of these materials has permitted their use as thin or thick films both on semiconductor substrates and on metal substrates for widely varying applications, more particularly due to the increased performance characteristics of their electronic properties, their etching properties and their mechanical behaviour (resistance to wear and corrosion).

The ceramic and dielectric deposits give the surfaces of the materials properties differing very significantly from those of the solid material used as the substrate. For example, it is possible to combine the low density of aluminum alloys (solid material) with the greatly increased hardness of surfaces coated with a ceramic deposit.

The thickness of the deposit varies between the individual applications. A deposit used for its mechanical properties is a thick deposit. If the deposit is used for its surface properties (reflectivity, resistivity, catalytic activity, etc.), it is a thin deposit.

The development of integrated circuits (IC) in microelectronics and microoptoelectronics (OEIC) is tending towards an increase in the integration density. This increase will make it possible to integrate ever more complex functions in even small dimensions. Therefore this evolution imposes a miniaturization of the elementary components. Conventional technological processes can then prove to be inadequate for achieving the miniaturization objectives. New techniques are then necessary for controlling ultrathin deposits.

The main procedures for depositing thin films are sputtering, electron guns, chemical vapour deposition (CVD), plasma-assisted CVD (PECVD), ultraviolet irradiation-induced CVD (UVCVD), fast heating or infrared irradiation-assisted CVD (RTCVD) and molecular beam (EJM).

As one of the aims of the invention is to produce "gentle" CVD deposits at low temperature, it is necessary to eliminate the more "violent" deposition methods such as sputtering, electron guns, molecular beam deposition and plasma-assisted deposition, such as e.g. deposition by discharge in gases.

Gas phase chemical deposition has been known since the end of the last century, but for the last thirty years there has been a considerable development in the field of semiconductors and the protection of metals against wear and corrosion. The conventional CVD procedure consists of bringing about a chemical reaction between the precursor gases of the deposit and the surface of the substrate. The chemical reaction is thermally activated by heating the substrate.

The precursors are either volatile compounds, or compounds having an adequate vapour pressure. The gaseous mixture of precursors and carrier gas enters the deposition reactor at a controlled pressure between atmosphere pressure and a fraction of atmospheric pressure. The substrate is kept hot at between 400° and 1400° C. with the aid of a temperature-regulated furnace. As a result of catalytic surface effects, a solid deposit progressively forms on the substrate surface and is created by germination and growth.

As a function of the heating temperature of the substrate, the supersaturation of the gases and their velocities, a microstructure which differs between individual solid deposits may be formed. Moreover, at low temperature, the increase in supersaturation produces on the substrate a pulverulent or even amorphous deposit, whereas at a higher temperature there is either a crystalline or polycrystalline layer, or a layer having a columnar crystalline structure, or whiskers.

The "low temperature" concept varies between individual substrates and individual layers or films. It typically extends from ambient temperature to approximately 350° C.

The known CVD processes have a certain number of advantages such as the purity and compactness of the films, a very good adhesion to the substrate, a significant covering power, a thickness uniformity for substrates having a large surface area with patterns having complex shapes and a deposit with a continuous or discontinuous modification of the composition.

The use of metalorganic compounds as gaseous precursors (OMCVD) also makes it possible to lower the deposition temperature.

This very widely used process unfortunately suffers from the following disadvantages: long process (heating, deposition and cooling take between one and several hours); possibility of causing secondary reactions (non-selective thermal cracking); possibility of contaminating deposited thin films if the gases used are not pure and if the hot walls of the deposition reactor degas; necessity for high temperatures, which are not always compatible with in particular the underlying materials or the technological stages taking place; creation of structural defects in the substrate, due to elasticity differences between the film and the substrate; deposition on the entire surface of the substrate without any localization possibility; purity of the deposit limited by the incorporation of organic residues if the precursors used are organometallic compounds (OMCVD).

In lamp assisted or induced CVD methods (LCVD), there is a continuous or pulsed irradiation (excimer laser) with the aid of a light source of a substrate surface placed in a reactor containing precursor gases and a carrier gas. The gaseous mixture used is usually kept at a pressure below 1.3 kPa.

As a function of the irradiation wavelength chosen and the orientation of the light flux with respect to the substrate surface, the photons will be absorbed in priority manner by the substrate when the light flux is perpendicular to the substrate and by the precursor when the light flux is parallel to the substrate. When the light flux is infrared (IR), it is a question of fast heating-assisted CVD and its advantageous use in the field of III-V semiconductors has already been described in numerous publications, cf. U.S. Pat. No. 4,914,059 and FR-A-2 618 455.

Ultraviolet light (UV)-assisted deposits have also been described in numerous publications such as e.g. the articles by R. V. Cvetanovic, J. Chem. Phys. 23, 1203, 1955, "Mercury Photosensitized Decomposition of Nitrous Oxide", by J. W. Peters, F. L. Gebhart and T. C. Hall, Solid. State Technol. 23, 121, 1980, "Low Temperature Photo-CVD Silicon Nitride: Properties and Applications".

In UV light-assisted deposits, the illumination causes virtually no temperature rise. Thus, the deposits are produced in a temperature range between 100° and 300° C.

If the photoreactions leading to a deposition of thin films are obtained with the aid of a catalyst gas introduced into the reactive gases or any other intermediary such as photosensitizers, there is a risk of contaminating the deposit.

It is pointed out that photosensitization is an indirect photolysis process of the multiphoto type with energy transfer via precursor gases or photosensitizers making it possible to reach the optical absorption of the precursor at wavelengths below the emission spectrum of known lamps.

Moreover, in general, there are either incomplete reactions (presence of residues and decomposition by-products in the films), or excessively slow deposition rates to have an industrial interest when the photoreactions are directly induced (without a catalyst or photosensitizer).

In addition, the thin films deposited at ambient temperature under ultraviolet irradiation are unusable due to their aggregative microstructure. It is then necessary to anneal then at temperatures which are not always compatible with the underlying materials or the technological stages taking place.

The invention also particularly relates to a process for CVD photochemical deposition of a material in particular making it possible to obviate the aforementioned disadvantages. This deposition process uses a particular light source.

Moreover, the use of this light provides access to new processes for the treatment of materials generally used in microelectronics or optoelectronics. Therefore the invention is not limited to a photochemical deposition process.

More specifically the present invention relates to a process for the photochemical treatment of a solid material consisting of exposing the latter to light pulses produced by at least one glow discharge elongated tube with a rare gas under low pressure and whereof the gas, the pressure and the characteristics of the discharge are adapted to said material and to its precursors, each pulse containing an extension emission spectrum from 160 to 5000 nm.

The precursors can consist of gases, liquids or solid present in the material, on the material and/or in the carrier gas glow. Moreover, in the invention, use is made of an atomic rare gas.

For performing the process according to the invention, use is made of a light source having flash tubes or lamps emitting in an extensive wavelength range extending from the far ultraviolet (VUV) to the near infrared (NIR). In particular, the gas, its pressure and the characteristics of the lamp are chosen in such a way that the spectrum has ionic emission lines in the ultraviolet, said lines being absorbable by said precursors and not by the material and a spectrum continuum in the visible and infrared.

The invention also relates to a light source comprising a) at least one glow discharge tube having a glass envelope transparent to radiation from 160 to 5000 nm, said envelope being hermetically sealed and containing a rare gas under low pressure, an anode and a cathode arranged in facing manner, b) an electrical circuit having modulatable electrical characteristics for the modulation of the discharge characteristics of the tube and the storage of the energy necessary for said discharge, said circuit having at least one variable capacitance capacitor connected in parallel with the tube, c) a constant current power supply source connected to the terminals of the capacitor for charging the latter, d) an exciting circuit for initiating an ionization of the gas and a discharge of the capacitor, the discharge of the capacitor producing a current pulse between the anode and the cathode and consequently a light pulse and e) a high voltage electric pulse generator for controlling the exciting circuit.

The lamp or tube according to the invention, contrary to those conventionally used in photochemical processes, has modulatable emission characteristics both as regards the overall light intensity and the duration of the pulses. The respective intensity of each wavelength can also be modulated. This lamp has a very considerable use flexibility making it possible not only to improve the treatment processes and in particular the deposition of thin films by photo-CVD, but also the use of novel photochemical treatment processes.

The weighting of each wavelength range (UV, visible, IR) is obtained by checking the pressure of the rare gas in the tubes and the intensity of the discharge current, which varies approximately from 1 to 10 kA/cm$^2$. In particular, for a given rare gas and a given discharge energy, the light intensity increases from the far UV to the near infrared when the pressure of the gas increases.

Advantageously, the pressure range of the gas in the flash tube is chosen between 1.3 and 40 kPa (10 to 300 Torr) or preferably between 6 and 27 kPa (approximately 50 to 200 Torr).

The duration of each flash, the frequency and the light intensity thereof can be separately adjusted, which gives the lamp a very considerable flexibility of use. In particular, each flash lasts 1 to 200 μs and the flash repetition frequency is 1 to 5000 Hz, as a function of the discharge energy of the capacitor.

The adjustment of the flash repetition frequency, the duration of each flash and the intensity of the current is a function of the specific application envisaged. This adjustment, for durations of 30 μs, makes it possible to render preponderant one or other of the wavelength ranges. In particular, the infrared dominates at a low current making it possible to obtain frequencies exceeding 30 Hz, whereas the ultraviolet dominates at a higher current making it possible to reach frequencies below 20 Hz.

Moreover, the greater the increase in the capacitor charging energy and therefore the intensity of the current delivered to the tube, the greater the contribution of the ultraviolet radiation.

The process according to the invention is in particular a vapour phase deposition process with respect to a thick or thin film of an insulant, metal, semimetal or semiconductor. According to the invention, this deposition process consists of exposing the substrate to precursors in gaseous, solid or liquid form of the film to be deposited during the exposure of said substrate to light pulses.

Compared with known CVD processes, the present deposition process offers a number of improvements. Thus, deposition takes a much shorter time due to the efficiency of the ultraviolet deposition and to the support of the infrareds. The interaction times such as the light absorption by the substrate, the photoreaction and the evacuation of secondary products formed are instantaneous and consequently do not slow down the reaction or contaminate the deposits. In addition, due to the joint action of the ultraviolet irradiation and infrared irradiation, the problems of germination, secondary reaction and contaminations of deposits are minimized.

Furthermore, by locally irradiating the substrate in the presence of gaseous precursors of the film to be deposited and by focussing the light flux, it is possible to produce a local deposit, unlike in the case of known CVD procedures. According to the invention the films are also deposited cold.

In a so-called cold treatment process, the maximum substrate heating temperature is dependent on the temperature which the surface of the substrate can withstand. In practice, the substrate is raised to temperatures between ambient temperature and 350° C. This temperature is due to the exposure of the substrate to light pulses and not to an additional heating.

The cold deposition makes it possible to limit the contaminations of the deposited films and to use substrates which have hitherto been unusable as a result of their poor temperature behaviour (organometallic glass, polymer, etc.). The substrate is also not stressed.

These cold deposits are also obtained with significant kinetics compatible with industrial processes. In particular, the deposition rate exceeds that obtained by conventional UVCVD. Thus, deposits at a typical speed exceeding 100 nm/minute can be obtained. Moreover, deposits of thick or thin films can be obtained for systems which previously required a photosensitization with mercury for obtaining growth rates compatible with microelectronic applications. In particular, the same deposition rates as those obtained conventionally with photosensitization have been obtained by the inventors without mercury sensitization for a silicon dioxide deposit starting with a gaseous mixture of silane and nitrogen protoxide or oxygen and for a silicon nitride deposit from a gaseous mixture of silane and ammonia.

Moreover, this photosensitization procedure, associated with the light source according to the invention, can give access to deposits which have not hitherto been possible using a light source alone.

The process according to the invention makes it possible to obtain cold a silicon oxynitride film from a mixture of silane, nitrogen protoxide and ammonia.

According to the invention, it is also possible to deposit semiconductor films, such as e.g. films of silicon from silane and its derivatives, germanium films from germane and III-V and II-VI material films from organometallics, as well as metallic films for organometallic precursors.

According to the invention, it is also possible to deposit in situ and in alternating manner films of different types. In particular, it is possible to envisage the production of a superlattice using the process according to the invention.

In this case, the inventive process comprises:
1) subjecting the substrate to at least one first gaseous, liquid or solid precursor of a first film during the exposure of the substrate to the said light pulses,
2) subjecting the substrate to at least one second gaseous, liquid or solid precursor of a second film during the further exposure of the substrate to said light pulses, and
3) successively repeating stages 1 and 2 until a desired film stack is obtained.

The treatment process according to the invention can also consist of the conversion of a native oxide of a III-V material into silicon dioxide. This can be of interest for producing MIS structures in III-V material. In order to carry this out, the III-V material is exposed to silane, whilst exposing it to the light pulses of the lamp. The silicon dioxide obtained is stable and leads to an improvement in the electronic performance characteristics of the III-V material.

In this conversion process, the ultraviolet radiation induces a specific reduction mechanism of the oxides by silane where the silicon is incorporated with hydrogen bonds, unlike in the case of the purely thermal process having no intermediate hydrogen-based stages. The concomitant contribution of the emitted infrared radiation stimulates the evacuation of the secondary products.

The process according to the invention can also consist of a cold treatment of the films deposited at ambient temperature by CVD under ultraviolet irradiation. Thus, films deposited at ambient temperature according to the prior art have an unarranged microstructure. In addition, the treatment of said films at ambient temperature with the lamp according to the invention makes the deposits more compact and also leads to the curing of certain chemical defects of said deposits. Therefore this treatment is equivalent to a heat treatment performed at high temperatures.

Due to the invention, it is now possible to deposit thin dielectric and ceramic films usable for microelectronic components by maintaining the substrate at ambient temperature and without carrying out any thermal annealing.

The inventive process can also consist of a cold surface cleaning. Thus, due to the wide spectral range and the emission in the ultraviolet, the irradiation of a substrate makes it possible to electronically excite (predissociate or dissociate) absorbed molecules. Concomitantly, the infrared contribution permits a desorption of fragments created by dissociation and therefore a cleaning of the surfaces. This cleaning can be carried out in the absence or presence of a cleaning gas. This effect was observed in the laboratory on hydroxyl and hydrogen bonds on the surface of III-V semiconductors and insulating silicon nitride and silicon dioxide films. This cold cleaning can also be carried out on metallic materials.

With the diversity of the processes described and the lamp or tube according to the invention, the integration of photo-assisted production stages for a component in situ can now be envisaged.

Other features and advantages of the invention can be gathered from the following non-limitative embodiments with reference to the attached drawings, wherein now:

BRIEF DESCRIPTION OF THE DRAWINGS

FIG. 4 The spectral luminance or brightness (Lλ) in Watt (cm$^2$.cm.sr) between 175 and 200 nm obtained at the discharge current maximum for tubes filled respectively with argon xenon and krypton.

With reference to FIGS. 1a and 1b, a description will be given hereinafter of a flash lamp permitting the performance of the process according to the invention. This lamp has several assemblies 2, each constituted essentially by a light discharge or flash tube 4 and an electrical circuit 6 for modulating and adapting the glow discharge of the flash tube 4. In practice, use is made of four assemblies 2 in order to obtain an optimum illumination, as well as a homogeneity of the illumination on materials having a significant surface area to be treated. For reasons of simplification in FIG. 1a, only a single assembly 2 is shown.

The flash tube 4 can have any random shape (cylindrical, spiral, etc.) with a length greatly exceeding the diameter thereof. FIG. 1 shows in exemplified manner linear tubes having a cylindrical envelope made from synthetic silica with a very high purity level and with a transmission window between 160 and 5000 nm. In particular, these tubes are produced from SUPRASIL I, II (R) marketed by HERAEUS.

Figure 2:
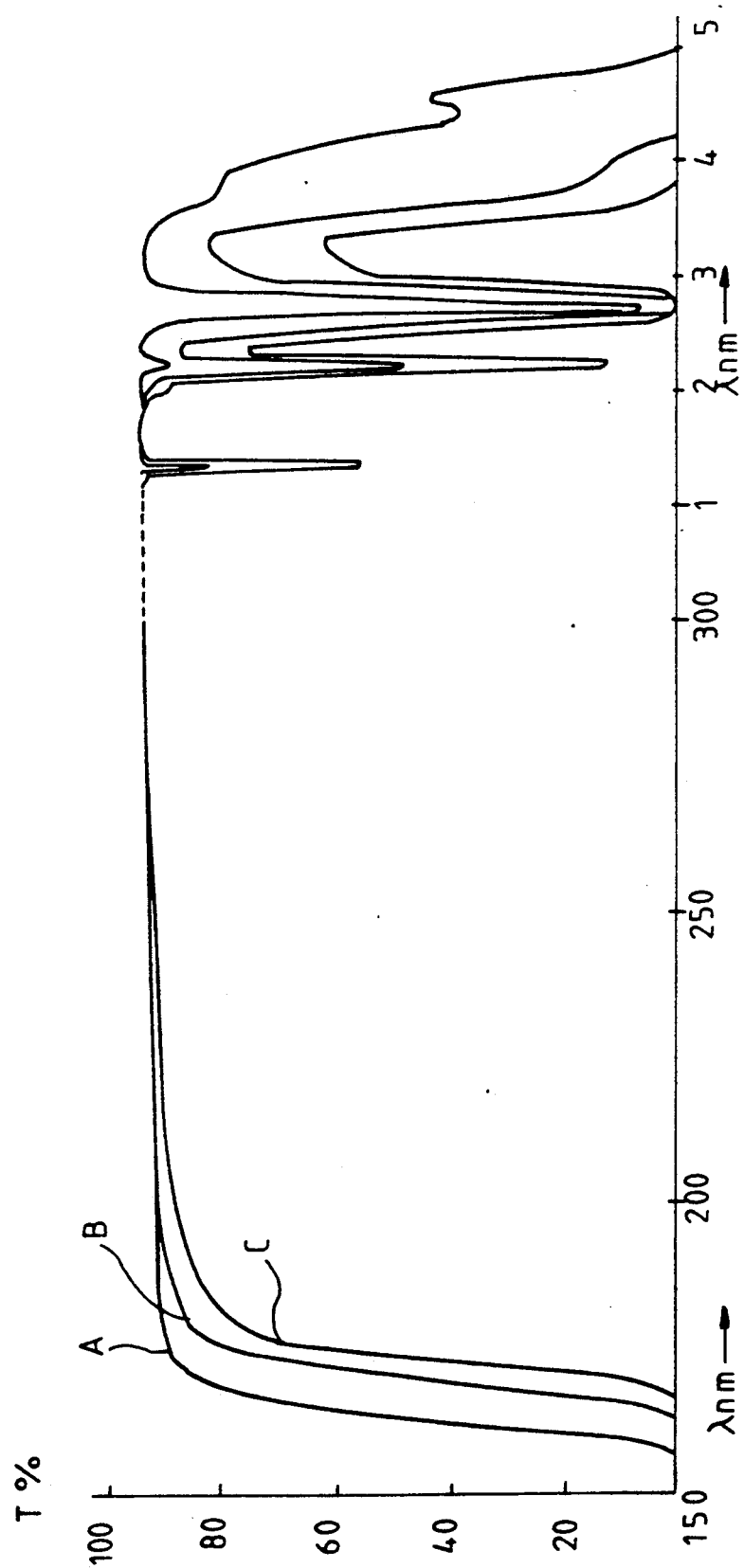
FIG. 2 The transmission percentage of the glass constituting the tubes as a function of the wavelength.

The transmission coefficient of said synthetic silica as a function of the wavelength is shown in FIG. 2. The spectra A, B and C respectively correspond to a silica thickness of 1, 10 and 30 mm.

These envelopes are hermetically sealed and contain a rare gas under low pressure, as well as an anode 10 and a cathode 8 arranged in facing manner. As a function of the light intensity sought in each wavelength range, the rare gas will be constituted by argon, krypton or xenon at pressures of 1.3 to 40 kPa (10 to 300 Torr) or preferably 6.6 to 27 kPa (50 to 200 Torr).

In practice, use is made of tubes which exceed by 1 to 2 cm the size of the samples to be treated. Consequently, the inter-electrode gap is also determined by the size of the sample to be treated. For example, it is possible to use for diameter 100 mm samples, tubes with an internal diameter of 8 mm, a length of 220 mm and a wall thickness of 1 mm. The inter-electrode gap is 120 mm and the electrodes are based on tungsten.

Figure 1A:
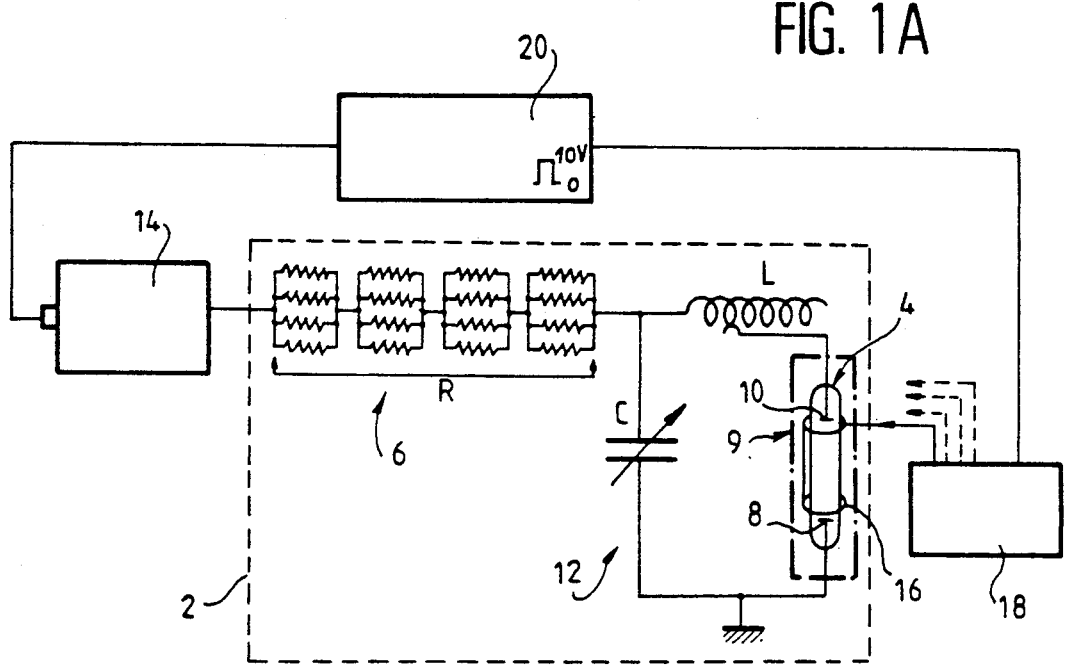
FIG. 1a and 1b Diagrammatically a flash tube lamp for performing the process according to the invention.
Figure 1B:
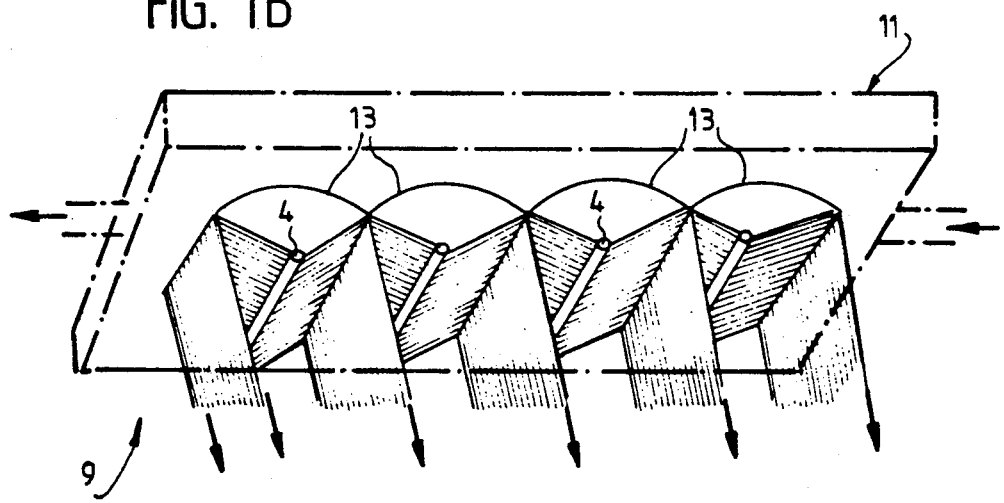

A formed convection cooling system 9 is provided around the flash tubes 4. The system comprises, as shown in FIG. 1b, a rigid plastic box or case 11 containing the tubes 4 and in which circulates an inert gas flow (e.g. nitrogen) under an overpressure. Besides cooling, it prevents the formation of ozone.

In order to obtain a homogeneous, uniform lighting, parabolic reflectors 13 are provided to the rear of the tubes, with one reflector per tube oriented in the longitudinal direction of the tube with the tube in the focus of the reflector. Thus, the light striking the material to be treated results from the light directly emitted by the tubes and the light reflected by the reflectors.

The electrical circuit 6 associated with each tube 4 has a LC circuit 12 connected in parallel between the anode and the cathode of the tubes 4. In order to modify the characteristics of the glow discharge of the tube 4, the capacitor 4 has a variable capacitance (by grouping capacitors) and the coil L a variable inductance. This LC circuit stores the electrical energy necessary for the discharge and shaping of the pulse of said light discharge.

A constant current electric power supply connected to the terminals of the capacitor C permits the charging of the latter. The charging voltage of said source or supply 14 is adjustable from 0 to a few kV.

The use of a constant current source permits a better control or checking of the energy stored by the capacitor and therefore a better reproducibility between the individual flashes, because the voltage rise at the capacitor terminals is linear as a function of time.

A resistive protection assembly R is located between the source 14 and the LC circuit so as to ensure that said source 14 does not deliver directly to the short-circuit constituted by the uncharged capacitor C.

An exciting circuit 16 constituted by a conductive wire surrounds each tube 4 along one of its generatrixes. This exciting circuit 16 initiates an ionization of the gas contained in the tube, as well as the discharge of the capacitor. This circuit 16 is connected to a very high voltage pulses generator 18.

In order to discharge the capacitor following its charging, the output of the very high voltage generator 18 is connected to the input of the power supply 14. This connection can be provided via a low voltage pulse generator 20, which permits the synchronization of the charge of the generator and the glow discharge.

The necessity for this pulse generator 20 is dependent on the characteristics of the source 14 and more specifically the time lag between the start of the discharge and the resumption of charging. If this lag exceeds the duration of the flash the generator 20 is unnecessary. In the opposite case, it is used for inhibiting this restarting and for preventing the source 14 from delivering into a tube 4 which is conducting.

Use is e.g. made of a THT pulse generator manufactured by Hartley Measurements Limited, model 350, which supplies a 30 kV pulse with a 1 μs rise time at a frequency between 1 and 100 Hz. The low voltage pulse generator is manufactured by Tekelec-Airtronic under the reference TE10. This generator has a setting independent of the time lag and the duration of the pulse, whose values can vary between 1 μs and 1 s. The amplitude of the output voltage is adjustable from 1 to 10 V under 50 ohms. The power supply 14 is manufactured by AEL Systems under reference 302 L 2KVP. The charging voltage is adjustable from 0 to 2 kV, the average power is 4000 J/s and the charging current is approximately 4 A. Moreover, the resistance assembly R is equivalent to a resistance of 47 ohms in series with the LC circuit.

For a given flash tube 4 containing a given gas at a given pressure, the values of the capacitance of the capacitor C and the inductance of the coil L are chosen as a function of the duration of the desired discharge, which is proportional to $(LC)^{\frac{1}{2}}$ and in order to obtain a discharge of the capacitor under conditions close to the critical damping, i.e. $(L/C)^{\frac{1}{2}}$ is approximately the impedance of the plasma column. This condition ensures the optimum transfer of electrical energy into light energy in the tube 4.

The power supply or source 14 charges the capacitor C with a quasiconstant current up to the voltage corresponding to the electrical energy provided for the discharge. According to the invention, the current density of the discharge is generally chosen between 1 and 10 $kA/cm^2$. For example, for a 40 μF capacitor, use is made of charges, as a function of the chosen tube, between 600 and 1800 V, which corresponds to discharge energies of 7.2 T 64.8 J. The maximum intensity of the discharge currents varies within a range 580 to 2300 Amperes.

Once the capacitor is charged, the THT pulses generator 18 permits the dielectric breakdown of the gas contained in the tube 4, which initiates the glow discharge. The dielectric breakdown of the gas is ensured by the circuit 16. The frequency of said pulse determines the frequency of the flashes. The upper limit of this frequency is imposed for a given electrical energy either by the minimum charging time due to the power source 14, or by the cooling conditions of the flash tube 4.

For the tubes 4 described hereinbefore and discharge times between 50 and 100 μs, the average power of the tubes must not exceed 800 W with forced convection cooling.

The pulse generator 20, synchronized by the THT trigger pulse, insures the blocking of the thyristors of the power supply 14 during the discharge and limits its cyclic ratio (charging time/time between charges) to less than 90% for the highest frequencies (50 Hz). Without said blocking, the supply would deliver into the tube in conduction and would maintain this state until its safety stoppage when the duration of the charging current exceeds a certain value (0.5 s).

For example, the light intensity range of the tube in the spectral range of 175 to 200 nm is instantaneously at the maximum emission of the lamp 0.5 to 20 kW/sr and in a mean value for one flash per second of duration 30 μs at mid-height 15 to 600 mW/sr.

Figure 3:
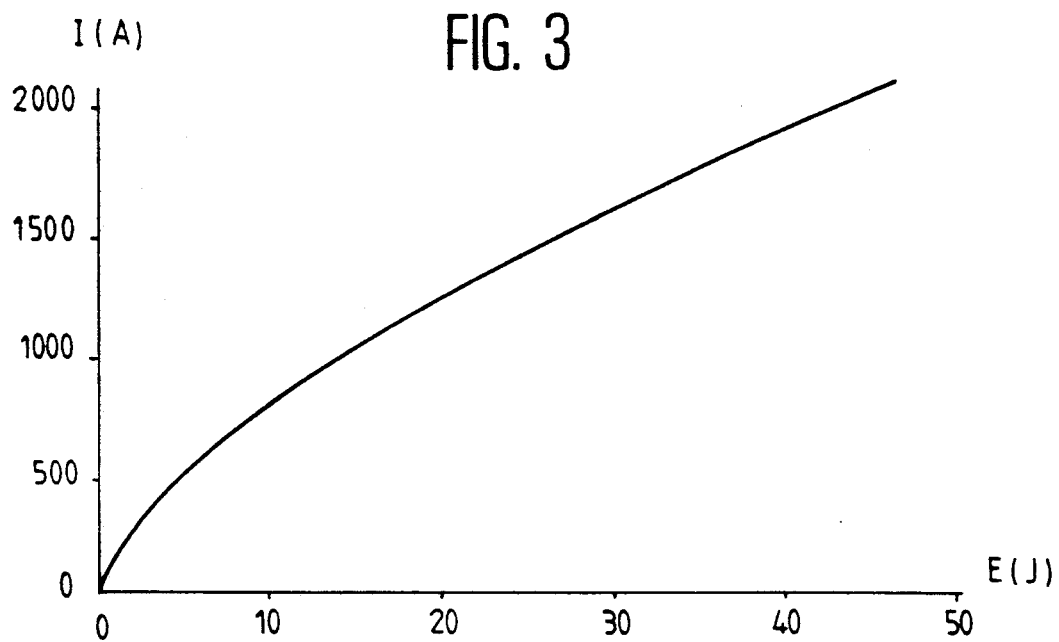
FIG. 3 The evolution of the current (I) expressed in Amperes as a function of the discharge energy (E) expressed in Joules of the capacitor in the case of a tube filled with krypton under 13.3 kPa.

FIG. 3 shows the evolution of the current as a function of the discharge energy of the capacitor in the case of a tube filled with krypton under 13.3 kPa. The mid-height durations of these discharges are approximately 30 μs. The variation range of this duration as a function of the energy is below 10%.

The above-described lamp has a light intensity in the range of far UV (VUV), which is particularly intense and namely 100 times more intense than low pressure mercury lamps conventionally used in photo-CVD.

In order to obtain the aforementioned emission conditions, use is made of argon, xenon or krypton at pressures of approximately 1.3 to 40 kPa and preferably 6.6 to 27 kPa. The low pressure limit in the tubes is linked with the fact that for a high discharge current, the sputtering of the cathode increases as the pressure in the tube decreases, which is prejudicial to the life of the tubes. For a pressure above the upper limit, the light intensity of the far UV is inadequate for carrying out the treatment.

In the same way, the duration of the discharge in the tube under high current must be sufficiently short to avoid plasma-wall thermal exchanges, so that a frequency range of 1 to 50 Hz is chosen. These thermal exchanges lead to the evaporation of the silica, which pollutes the initial gas, thereby producing a reduction of the plasma temperature and therefore a significant reduction to the UV emission.

FIG. 4 shows the spectral luminance or brightness L, as a function of the wavelength obtained at the maximum of the discharge current for each tube. The continuous line curve corresponds to the emission of a tube containing argon at 13.3 kPa for a discharge energy of 36 J, the broken line curve to the emission spectrum of a tube containing xenon at 13.3 kPa for a charging energy of 51 J and the dotted line curve to the emission spectrum of a tube containing krypton at 13.3 kPa for a charging energy of 45 J.

The radiation of the tubes in the range 175 to 200 nm (far ultraviolet) is constituted by a recombination continuum on which are superimposed strong lines of the ionized atom of the gas in question. The distribution of the spectral lines and their intensity difference makes it possible to select the most suitable gas for each photochemical process used.

Compared with the xenon tube according to the invention, there is a higher instantaneous spectral brightness for argon tubes, the maximum reached being $4.4.10^9$ W/$cm^2$.sr) and the maximum instantaneous brightness is 570 W ($cm^2$.sr) for the spectral range 175 to 200 nm. The mean brightness value, reduced to a 1 Hz flash frequency, is 18 mW ($cm^2$.sr).

This difference between the two tubes is explained by the fact that for a comparable discharge current density, the temperature of an argon plasma is higher than that of a xenon plasma, bearing in mind the higher ionization potential of argon. This has the consequence of reinforcing the emission spectrum in the ultraviolet.

It should also be observed that for the argon tube, the relative contribution of the luminance or brightness due to the spectral lines on the total luminance or brightness is greater than in the case of the xenon tube.

The following table gives the maximum instantaneous brightness values and the values averaged to 1 Hz measured for these two tubes in the spectral range 180 to 200 nm. Details are also given of the average and maximum brightness of a known U-shaped mercury vapour lamp having the highest emission in this range and therefore a resonance line at 185 nm.

TABLE I

| Lamp | Instantaneous brightness W ($cm^2 \cdot sr$) | Average brightness mW ($cm^2 \cdot sr$) |
|---|---|---|
| xenon 13.3 kPa | 170 | 5.3 |
| argon 13.3 kPa | 570 | 18 |

TABLE I-continued

| Lamp | Instantaneous brightness W (cm² · sr) | Average brightness mW (cm² · sr) |
|---|---|---|
| U-shaped mercury | $1.0 \cdot 10^{-2}$ | 6.3 |

Table I shows that the instantaneous brightnesses emitted by the flash tubes are considerably higher than those of mercury vapour lamps. The average brightness of the tubes according to the invention in the case of a 1 Hz flash frequency is in the case of the xenon tube of the same order of magnitude as that of the most intense mercury lamp and for the argon tube three times higher than this. Moreover, the emission surface of the plasma in the flash tube according to the invention is higher than that of the plasma column in the U-shaped mercury lamp.

In addition, the average light intensity emitted by the tubes according to the invention at 1 Hz and in the 180 to 200 nm band exceeds that of the mercury vapour lamps used.

Tests with an argon lamp under a pressure of 13.3 kPa have shown that for the highest electrical discharge energy, there is a saturation of the photochemical effect. Thus, for each tube a discharge energy range is chosen, which makes it possible to adapt the photon flux to the needs of the application and to vary the maximum frequency of the flashes in accordance with the energy.

Figure 5:
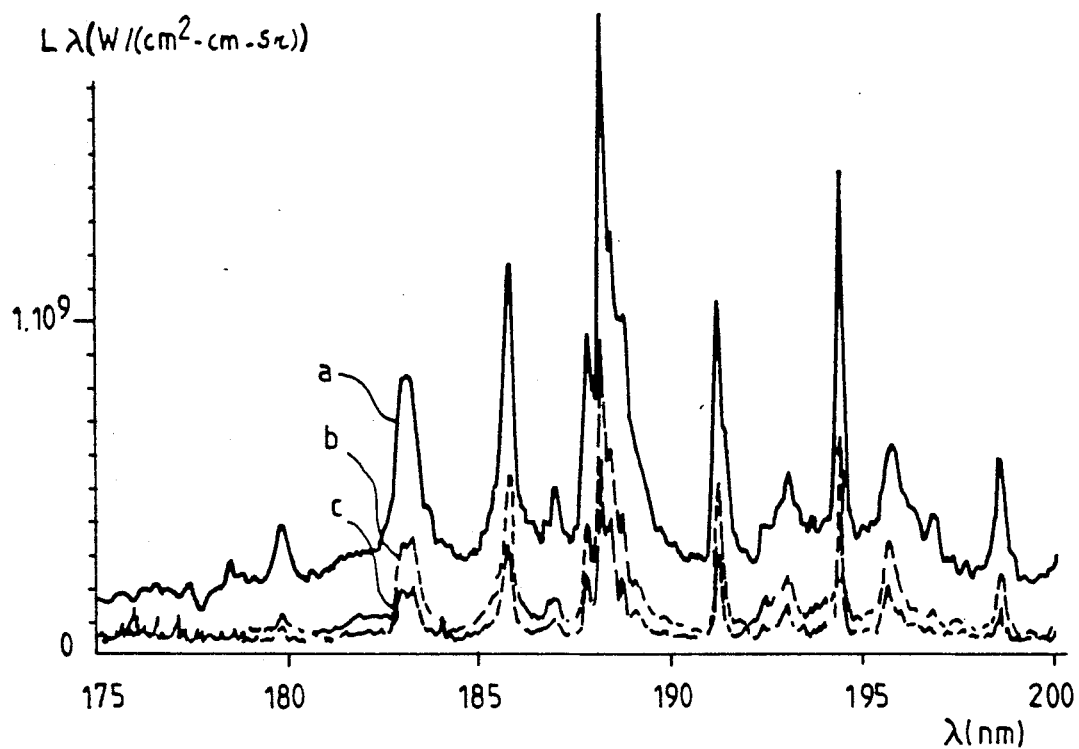
FIG. 5 The evolution of the spectral luminance (Lλ) expressed in W (cm$^2$. cm.sr) between 175 and 200 nm for a tube filled with krypton under 13.3 kPa for three discharge energies, the spectra, A, B and C respectively corresponding to 45, 24 and 16 J.

For illustration purposes, FIG. 5 shows the variations of the spectral brightness as a function of the wavelength for a tube filled with krypton under 13.3 kPa for these discharge energies. The curves A, B and C respectively correspond to energies of 45, 24 and 16 J. These curves show that the greater the increase in the charging energy, the more the intensity of the ultraviolet radiation increases.

Figure 6:
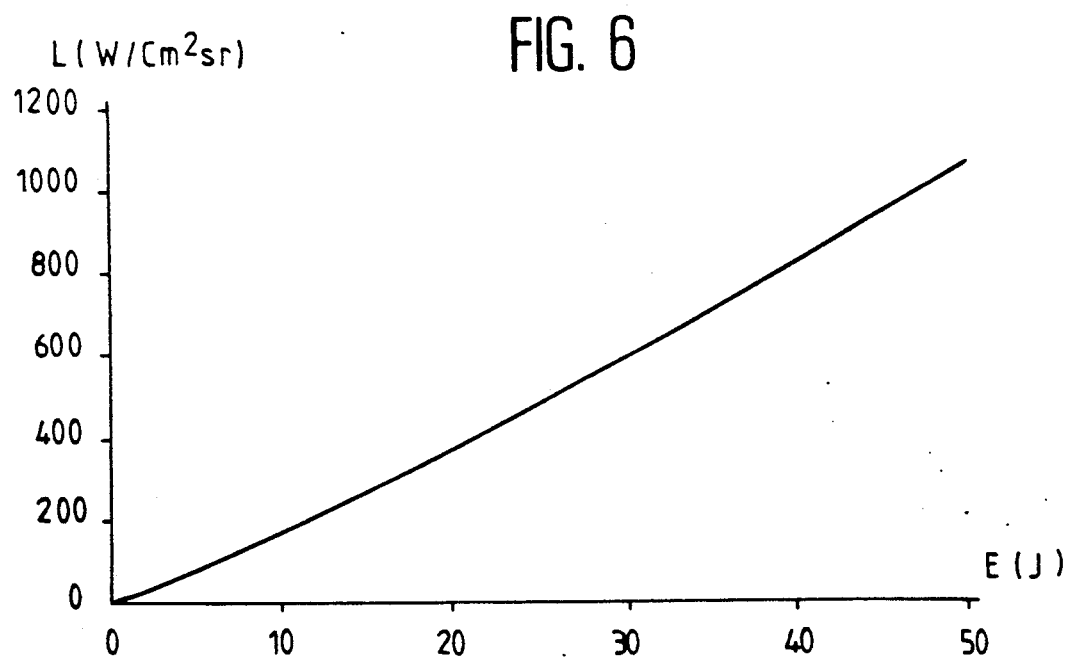
FIG. 6 The variations of the maximum luminance (L) in the spectral interval 175 to 200 nm in W (cm$^2$.sr) as a function of the discharge energy (E) in Joules for a tube filled with krypton at 13.3 kPa.

FIG. 6 shows the variations of the maximum brightness as a function of the charging energy for a tube containing krypton at 13.3 kPa, in the spectral range 175 to 200 nm. This curve shows that the brightness increases linearly with the charging energy.

Thus, the possibility of choosing for each envisaged photochemical process the type of gas (spectral distribution of the ionic lines), the electrical energy of the discharge (instantaneous photo flux) and the frequency of the flashes permits a good adaptation of the characteristics of said lamp.

Moreover, the tests carried out on the reactor have also shown that the part of the visible radiation and the near infrared radiation emitted by said lamp led to a significant improvement with respect to the quality of the CVD deposits produced on a substrate. Thus, the aforementioned light source makes it possible to combine in the same irradiation the advantage of UVCVD and rapid heating CVD.

Figure 7:
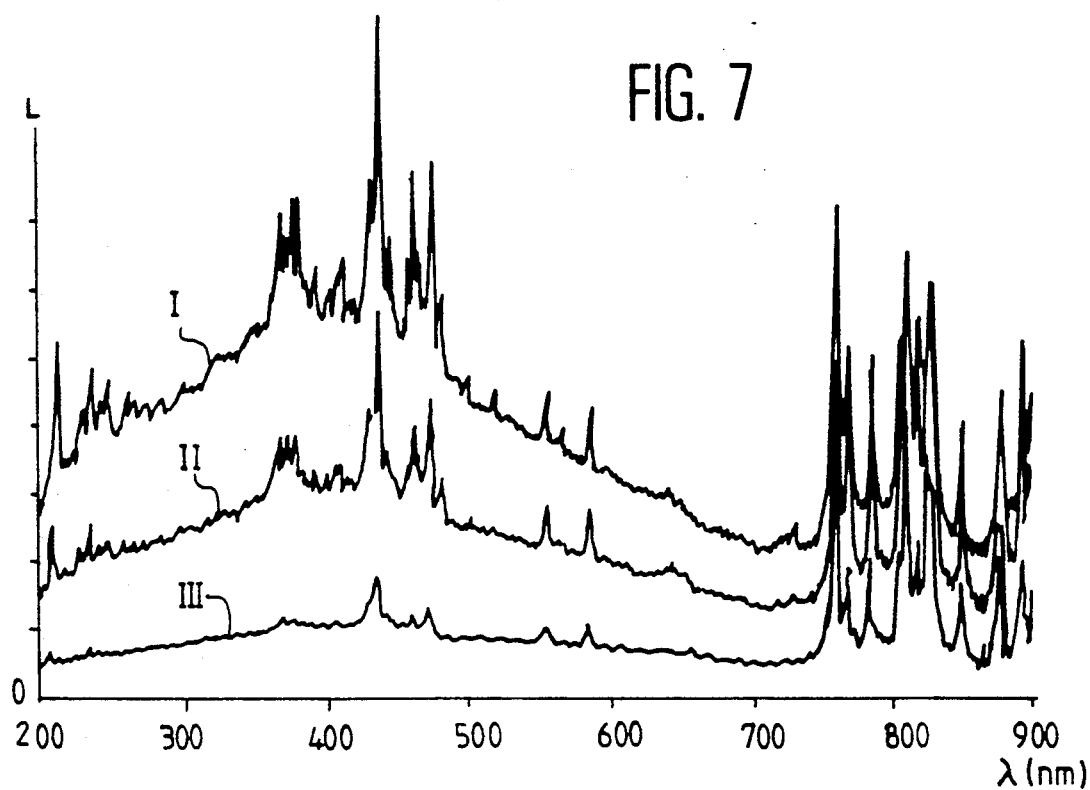
FIG. 7 The relative evolution of the spectral luminance (L) as a function of the wavelength in nanometers for different discharge energies of a tube filled with krypton at 13.3 kPa.

FIG. 7 shows the emission spectrum of the lamp according to the invention between 200 and 900 nm. The spectra of FIG. 7 and those of a tube containing krypton at 13.3 kPa. The spectra I, II and III respectively correspond to a charging energy of 45, 28.8 and 12.8 J.

These curves make it clear that the increase in the charging energy at therefore the current intensity passing through the tube leads to a greater contribution of the radiation in the ultraviolet.

Figure 8:
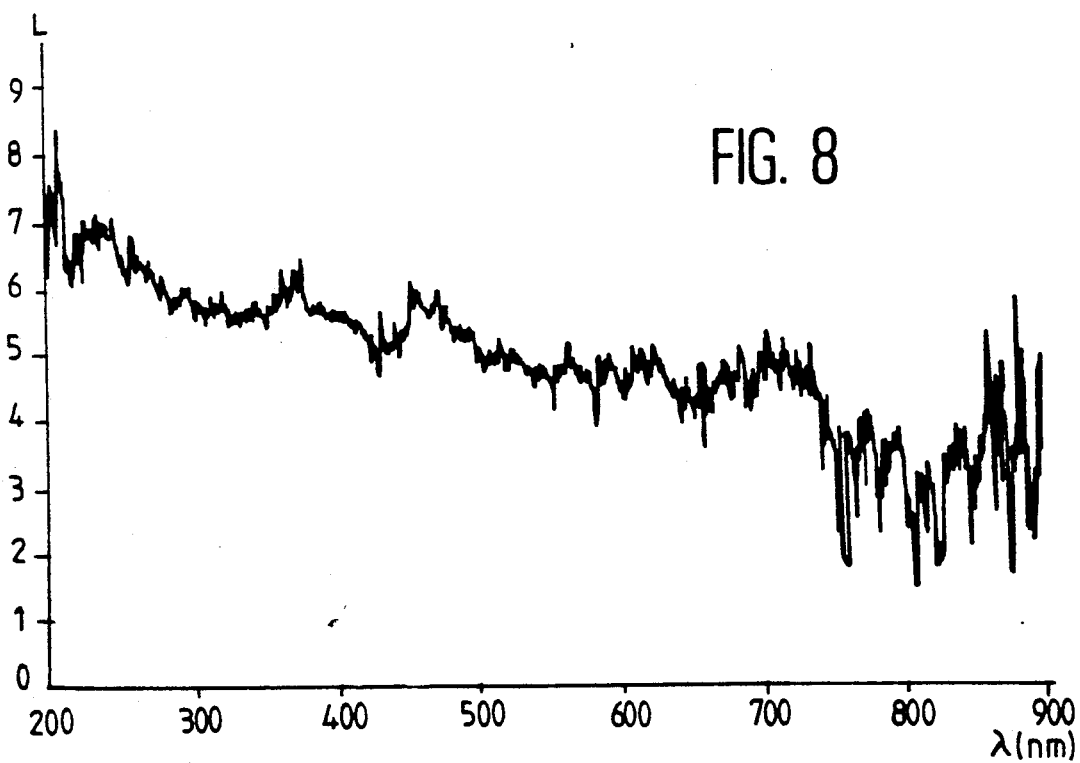
FIG. 8 The ratio of the spectra of FIG. 7 as a function of the wavelength in nanometers for two discharge energies of 45 and 12.8 J respectively.

FIG. 8 gives the relationship of spectra I and III in FIG. 7 confirming that the contribution of the ultraviolet radiation increases with the charging energy.

It is also important to note that the previously given spectra are only illustrative and that the parameters of the lamp can be optimized as a function of each photochemical treatment and in particular as a function of the gaseous precursors used in the different treatments.

The lighting source used in the invention can be advantageously compared with deuterium lamps and also has a more extensive emission spectrum than laser sources. This lamp also emits in the ultraviolet with a brightness 100 times greater than low pressure, mercury vapour lamps conventionally used in photo-CVD deposition processes and which generally emit at 185 nm with a brightness of 1.7 nW/cm².sr or at 254 nm with a brightness of 15 mW/cm².sr.

The spectrum in the spectral range 180 to 260 nm is a superimposition of a continuum and discreet lines. It is possible to vary the distribution of the energy between the continuum and the lines by varying the pressure and nature of the gas.

For illustration purposes, the following table II gives the values of the maximum instantaneous brightnesses and the brightnesses averaged to 1 Hz measured for three tubes in the spectral band 180 to 260 nm. The values are also given for the maximum and average brightness of a known, U-shaped mercury vapour lamp having the highest emission in said range and with resonance lines of 185 and 254 nm.

TABLE II

| Lamp | Instantaneous brightness W (cm² · sr) | Average brightness mW (cm² · sr) |
|---|---|---|
| krypton 13.3 kPa | 3400 | 100 |
| argon 13.3 kPa | 1650 | 50 |
| xenon 13.3 kPa | 1400 | 42 |
| U-shaped mercury | $1.6 \cdot 10^{-1}$ | 9.4 |

The lamp according to the invention emitting from 160 nm makes it possible, compared with such mercury lamps, to carry out a direct photolysis deposition process, i.e. by direct irradiation of the substrate on which the deposit is to be made, whereas hitherto it was only possible to carry out an indirect photolysis using a photosensitizing gas.

Figure 9:
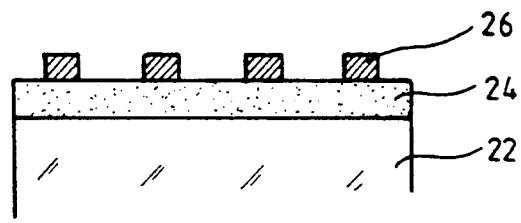
FIG. 9 Diagrammatically the treatment process according to the invention.

As a result of the treatment process according to the invention and the above-described lamp, it is now possible to produce a MIS capacitor in an InP substrate, like that shown in FIG. 9.

To this end, a n-doped InP substrate 22 is introduced into a synthetic silica photo-CVD reactor, whose transmission window is given in FIG. 2. The substrate 22 is cleaned by subjecting it to a silane flux and to pulses emitted by the previously described lamp.

This is followed by the deposition of a SiO₂ film 24 by subjecting the InP substrate at 200° C. to a mixture of silane and oxygen and irradiating it with the light source according to the invention. This is followed by an annealing of the silica by irradiating it with the flash source under an oxygen flux. This is followed by a localized deposition of titanium 26 by locally irradiating the substrate in accordance with a normal incidence in the presence of a TiCl₄ flux. This located deposition stage in repeated several times so as to form various titanium contacts. The InP plate is then removed from the reactor.

The annealing of the silica under the oxygen flux and the irradiation with the lamp according to the invention consists of transforming the silicon oxide film deposited of general formula $SiO_xH_y$ with $0<x<2$ and $0<y<4$ into stoichiometric $SiO_2$. in this cold treatment there is no melting of the deposited material, as in conventional annealing processes.

Performance examples of the process according to the invention will now be given.

EXAMPLE 1

This examples relates to the deposition of a 60 to 70 nm thick $SiO_2$ film on a monocrystalline silicon or InP substrate. Use is made of a xenon lamp under a pressure of 13.3 kPa (100 Torr).

The operating conditions are as follows:
silane flow rate:10 cm$^3$/min,
oxygen flow rate:100 cm$^3$/min,
nitrogen flow rate (carrier gas):100 cm$^3$/min,
total pressure:0.65 kPa (5 Torr),
substrate temperature due to irradiation:100° C.,
substrate exposure time to lamp according to the invention:10 min,
light flash frequency:7 Hz,
electrical energy:28.8 J,
average brightness:7 nW/cm$^2$.sr for 1 Hz,
spectral range:175 to 200 nm,
deposition rate:6 nm/min.

The refractive index of the film obtained, measured by ellipsometry, is 1.46 at the wavelength of 0.6 μm of a helium-neon laser.

EXAMPLE 2

This example relates to the cold treatment of a $SiO_2$ film deposited in accordance with example 1.

This treatment is carried out with the lamp of example 1. It makes it possible to obtain an electronic quality $SiO_2$ film. This treatment reduces the quantity of SiH bonds present in the oxide film resulting from the silane. The treatment is performed under nitrogen. The SiH and SiOH groups and water present in the pores of the film constitute the precursors of $SiO_2$.

nitrogen flow rate:500 cm$^3$/min,
total pressure:1.85.10$^2$ Pa (1.5 Torr),
substrate temperature due to irradiation:100° C.,
film irradiation time:3.5 hours,
light flash frequency:7 Hz,
electrical energy:28.8 J,
average brightness:7 nW/cm$^2$.sr for 1 Hz,
spectral range:175 to 200 nm.

EXAMPLE 3

This example relates to the cleaning of hydroxyls from the surface of a silica film deposited on a InP substrate under a nitrogen flux with the lamp of example 1. The HO-Si-O groups of the film constitute the precursors of $SiO_2$.

silica thickness:15 nm,
nitrogen flow rate:500 cm$^3$/min,
Total pressure:1.85.10$^2$ Pa (1.5 Torr),
substrate temperature due to irradiation:220° C.,
substrate irradiation time:15 min,
light flash frequency:7 Hz,
electrical energy:28.8 J,
average brightness:7 nW/cm$^2$.sr for 1 Hz,
spectral range:175 to 200 nm.

EXAMPLE 4

This example relates to the transformation of the native oxide of the InP or GaAs substrate into stoichiometric $SiO_2$. This conversion takes place with the lamp of example 1 under a silane flux. The native oxide and the silane constitute the precursors of $SiO_2$.

silane flow rate:20 cm$^3$min,
total pressure:1.3.10$^2$ Pa (1 Torr),
substrate temperature due to irradiation:220° C.,
substrate irradiation time:125 min,
light flash frequency:25 Hz,
electrical energy:28.8 J,
average brightness:7 mW/cm$^2$.r for 1 Hz,
spectral range:175 to 200 nm.

EXAMPLE 5

A 600 nm $SiO_2$ film was deposited on a silicon substrate under the same conditions as in example 1 with the exception of the deposition time and therefore the exposure to the lamp, which was 100 mn. This film was then treated cold as in example 2, under nitrogen for 105 min.

Figure 10:
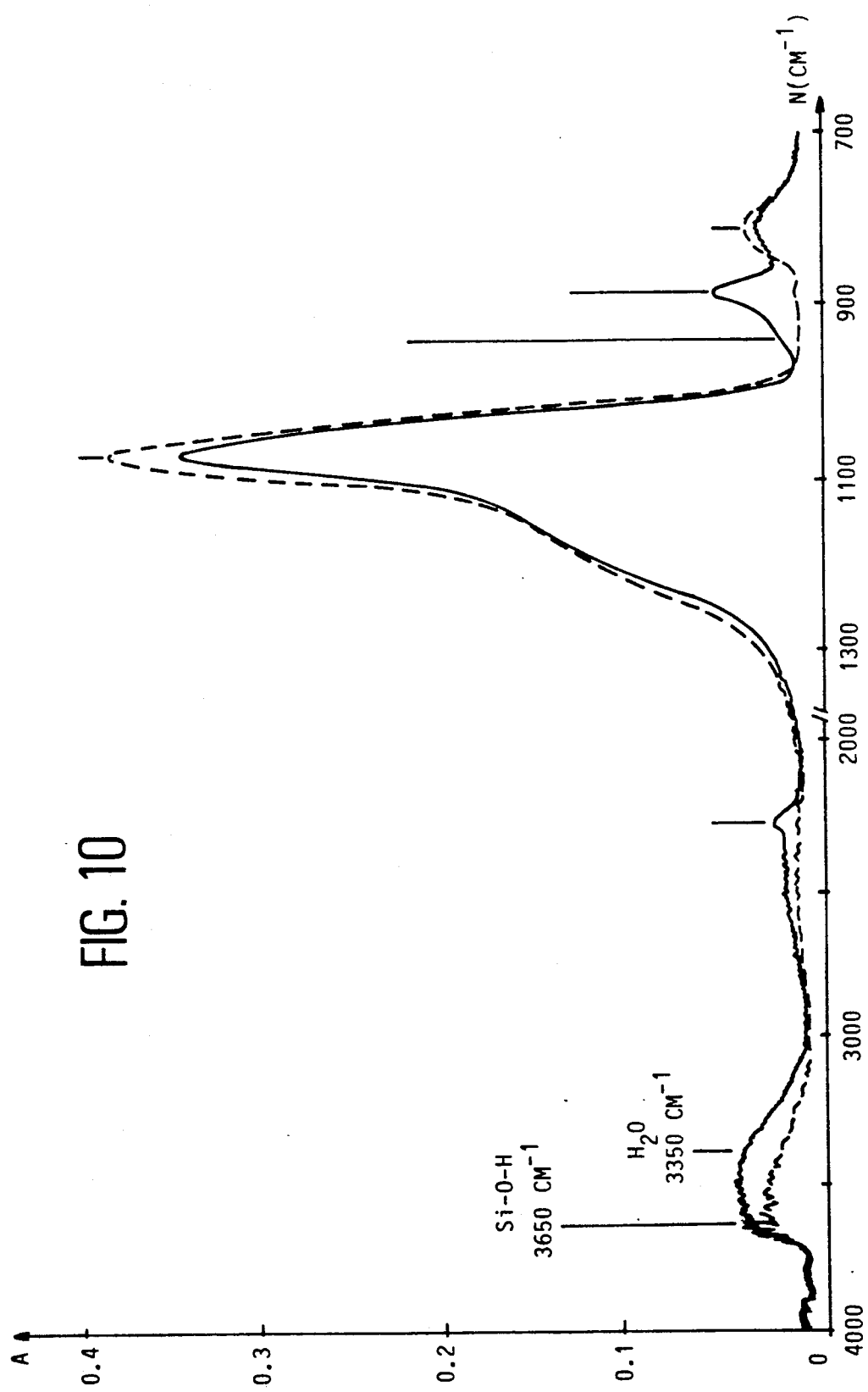
FIG. 10 The evolution of the Fourier series infrared spectrum from a $SiO_2$ film deposited according to the invention (curve d) and then treated according to the invention (curve e).

Curves d and e of FIG. 10 respectively give the evolution of the Fourier series IR spectra (FTIR) of the $SiO_2$ film before and after the treatment under nitrogen. These curves give the variations of the extinction (A) as a function of the number of waves (N) expressed in cm$^{-1}$. These curves show the different groups of the $SiO_2$ film ($-Si-O-H$, $O_3Si-H$, $-Si-O$, $H_2$) etc.), as well as their absorption frequency in the extension mode and the flexion mode.

By comparing these curves, it can be seen that there is a total disappearance of the Si-H bonds following direct irradiation of the $SiO_2$ film and conversely an increase of the SiO bonds.

Figure 11:
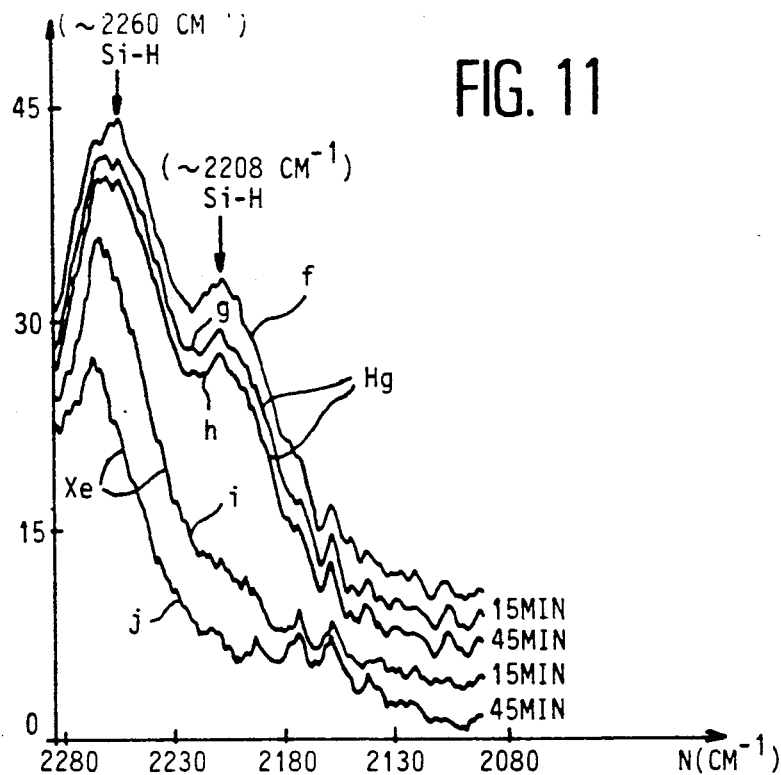
FIG. 11 The evolution of the Fourier series infrared spectrum for $SiO_2$ films deposited by photolysis with a mercury lamp, treated according to the invention (curves i and j) and irradiated by a mercury lamp (curves g and h).

EXAMPLES 6 AND 7 AND COUNTER-EXAMPLES 60 nm $SiO_2$ films deposited by photolysis using a continuous low pressure mercury lamp were treated as in example 2 and under nitrogen. In parallel, 60 nm $SiO_2$ films deposited under the same conditions were treated in situ by a continuous low pressure mercury lamp. The curves of FIG. 11 give the evolution of the FTIR spectra of the $SiO_2$ films prior to treatment and then following treatment (variations of the extinction A with the number of waves N). The curve f is relative to an untreated $SiO_2$ film. The curves g and h relate to films treated with a mercury lamp for respectively 15 and 45 min. Curves i and j (respectively corresponding to examples 6 and 7) relate to films treated with the lamp according to the invention for respectively 15 and 45 min.

These curves make it clear that the Si-H bonds of the $SiO_2$ films disappear with the treatment process according to the invention, whereas they remain in the case of a mercury lamp irradiation. Moreover, with the process according to the invention, the number of Si-H bonds decreases with the irradiation time.

EXAMPLE 8

Figure 12:
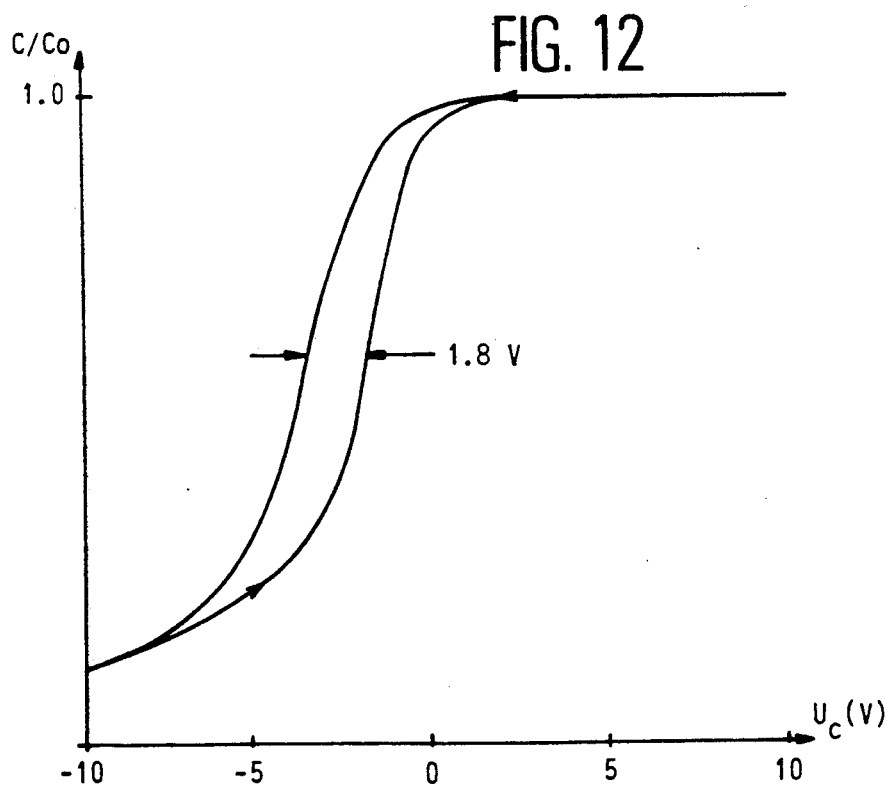
FIG. 12 The variations of the capacitance of a capacitor having a $SiO_2$ film deposited and treated according to the invention, as a function of the voltage $U_c$ applied at its terminals.

A capacitor is produced by depositing a metallic film on a 60 nm thick $SiO_2$ film deposited as in example 1 and then treated as in example 2 for three hours only. FIG. 12 gives the variations of the capacitance as a standardized value (C/Co) of the capacitor as a function of the voltage $U_c$, expressed in volts, applied to its terminals. It can be seen that the hysteresis of the capacitor of FIG. 12 is not excessive (displacement of only 1.8 v between the charge and the discharge). This capacitor also has a good evacuation and good accumulation of the charges.

I claim:

1. Process for the photochemical treatment of a solid material consisting of exposing said material to light pulses produced by at least one glow discharge, elongated tube with a rare gas under low pressure and whereof the gas, pressure and characteristics of the discharge are adapted to said material and its precursors, each pulse containing an extensive emission spectrum between 160 and 5000 nm.

2. Process according to claim 1, characterized in that the gas, its pressure and the characteristics of the lamp are chosen so that the spectrum has ionic emission lines in the ultraviolet, said lines being absorbable by said precursors and not by the material, and a spectrum continuum in the visible and infrared.

3. Process according to claim 1, characterized in that each light pulse lasts 1 to 200 $\mu$s and the frequency of the pulses is between 1 and 5000 Hz.

4. Process according to claim 1, characterized in that the discharge has a current density from 1 to 10 $kA/cm^2$.

5. Process according to claim 1 for the vapour phase deposition of a thick or thin film on a substrate, characterized in that it consists of subjecting the substrate to the action of at least one gaseous, liquid or solid precursor of said film whilst exposing the substrate to said light pulses.

6. Process according to claim 5, characterized in that the substrate is kept at a temperature chosen from within the range extending from ambient temperature to 300° C., said temperature resulting from the exposure to the light pulses.

7. Process according to claim 5, characterized in that the film is an insulant, a metal, a semimetal or a semiconductor.

8. Process according to claim 5, characterized in that the film is a silicon dioxide film and the gaseous precursor is a mixture of silane and oxygen or nitrogen protoxide.

9. Process according to claim 5, characterized in that the film is a silicon nitride film and the gaseous precursor is a mixture of silane and ammonia.

10. Process according to claim 5, characterized in that the film is a silicon oxynitride film and the gaseous precursor is a mixture of silane, nitrogen protoxide and ammonia.

11. Process according to claim 1 for the local vapour phase deposition of a thick or thin film on a substrate, consisting of exposing the substrate to at least one gaseous, liquid or solid precursor of said film and simultaneously locally exposing the substrate to said light pulses.

12. Process according to claim 1 for the in situ, alternating vapour phase deposition of films having a different nature and comprising
   1) subjecting the substrate to at least one first gaseous, liquid or solid precursor of a first film, whilst exposing the substrate to said light pulses,
   2) subjecting the substrate to at least one second gaseous, liquid or solid precursor of a second film whilst exposing the substrate once again to said light pulses and
   3) successively repeating stages 1 and 2 until a desired film stack is obtained.

13. Process according to claim 1 for the conversion of a native oxide of a III-V material into silicon oxide, characterized in that it consists of subjecting the III-V material to silane whilst exposing the material to said light pulses.

14. Process according to claim 1 for the cold cleaning of a semiconductor insulating or metallic material, characterized in that the material, maintained at ambient temperature, is exposed to the action of a cleaning gas, whilst exposing it to the said pulses.

15. Process according to claim 14, characterized in that the material is a semiconductor produced with III and V elements of the periodic table, silicon dioxide or silicon nitride.

16. Process according to claim 1 for the cold treatment of a thin film deposited at ambient temperature by photo activation.

* * * * *

UNITED STATES PATENT AND TRADEMARK OFFICE
CERTIFICATE OF CORRECTION

PATENT NO. : 5,221,561

DATED : June 22, 1993

INVENTOR(S) : Jean Flicstein, Yves Nissim, Christian Licoppe and Yves Vitel

It is certified that error appears in the above-identified patent and that said Letters Patent is hereby corrected as shown below:

On the title page, item [56] References Cited, under Other Publications last reference, line 1, delete "Tseng" and insert --Tzeng--;

line 2, after "1979" insert --,-- (comma); and line 2, delete "$BF+_2$" and insert --$BF_2+$--.

Column 1, line 5, insert the centered heading --DESCRIPTION--.

Column 3, line 33, delete "then" and insert --them--;

line 41, after "light" insert --source--;

line 55, delete "solid" and insert --solids--; and line 57, delete "glow" and insert --flow--.

Column 6, line 60, delete "now:" and insert --show:--.

UNITED STATES PATENT AND TRADEMARK OFFICE
CERTIFICATE OF CORRECTION

PATENT NO. : 5,221,561

DATED : June 22, 1993

INVENTOR(S) : Jean Flicstein, Yves Nissim, Christian Licoppe and Yves Vitel

It is certified that error appears in the above-identified patent and that said Letters Patent is hereby corrected as shown below:

Column 8, line 9, delete "formed" and insert --forced--; and line 49, delete "pulses" and insert --pulse--.

Column 9, line 1, delete "TE10" and insert --TE 10--.

Column 11, line 34, delete "these" and insert --three--;

line 48, delete "photo" and insert --photon--; and line 66, delete "at" and insert --and--.

Column 12, line 50, delete "in" and insert --on--;

line 65, delete "located" and insert --localized--; and line 66, delete "in" and insert --is--.

Column 13, line 5, after "treatment" insert --,-- (comma); and

UNITED STATES PATENT AND TRADEMARK OFFICE
CERTIFICATE OF CORRECTION

PATENT NO. : 5,221,561
DATED : June 22, 1993
INVENTOR(S) : Jean Flicstein, Yves Nissim, Christian Licoppe and Yves Vitel It is certified that error appears in the above-identified patent and that said Letters Patent is hereby corrected as shown below:

line 62, delete "Total" and insert --total--.

Column 14, line 8, delete "cm³min," and insert --cm³/min,--; and line 30, delete "H₂)" and insert --H₂0,--.

Column 16, line 42, delete "photo" and insert --photon--.

Signed and Sealed this

Fifteenth Day of March, 1994

*Attest:*

BRUCE LEHMAN

*Attesting Officer*     *Commissioner of Patents and Trademarks*